(12) United States Patent
Winter et al.

(10) Patent No.: US 11,350,537 B2
(45) Date of Patent: May 31, 2022

(54) ELECTRICAL FEEDTHROUGH ASSEMBLY

(71) Applicant: ANALOG DEVICES, INC., Norwood, MA (US)

(72) Inventors: Adam T. Winter, Windham, NH (US); Edward James Burg, Littleton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 16/827,115

(22) Filed: Mar. 23, 2020

(65) Prior Publication Data

US 2020/0375049 A1 Nov. 26, 2020

Related U.S. Application Data

(60) Provisional application No. 62/850,818, filed on May 21, 2019.

(51) Int. Cl.
| | |
|---|---|
| *H05K 5/00* | (2006.01) |
| *H05K 5/02* | (2006.01) |
| *H01B 1/02* | (2006.01) |
| *H05K 7/20* | (2006.01) |

(52) U.S. Cl.
CPC ............ *H05K 5/0247* (2013.01); *H01B 1/026* (2013.01); *H05K 7/20463* (2013.01)

(58) Field of Classification Search
CPC ....... H05K 5/0247; H05K 7/204; H01B 1/026
See application file for complete search history.

(56) References Cited

U.S. PATENT DOCUMENTS

| | | | | |
|---|---|---|---|---|
| 4,841,101 A | * | 6/1989 | Pollock | ................ H01B 17/305 174/152 GM |
| 5,223,672 A | * | 6/1993 | Pinneo | ................ B23K 20/129 156/73.5 |
| 5,523,622 A | | 6/1996 | Harada et al. | |
| 5,819,401 A | * | 10/1998 | Johannes | ............... H05K 3/368 29/830 |
| 5,994,975 A | * | 11/1999 | Allen | ........................ H01P 1/04 174/152 GM |

(Continued)

FOREIGN PATENT DOCUMENTS

DE    20 2014 104 574 U    11/2014

OTHER PUBLICATIONS

Alléaume, PF et al., "Millimetre-wave hot-via interconnect-based GaAs chip-set for automotive RADAR and security sensors," Proceedings of the 3rd European Microwave Integrated Circuits Conference, Oct. 2008, Amsterdam, The Netherlands, pp. 52-55.

(Continued)

*Primary Examiner* — Pete T Lee
(74) *Attorney, Agent, or Firm* — Knobbe Martens Olson & Bear LLP

(57) ABSTRACT

Various embodiments relate to an electrical feedthrough assembly an elongate conductor and a collar at least partially surrounding the elongate conductor along a portion of a length of the elongate conductor. The collar can be composed of a material having a thermal conductivity of at least 170 W/(m-K). A shell can be disposed around the collar. At one or more operating frequencies, at least a portion of a length of the electrical feedthrough assembly can be selected to provide at least one quarter wave transform.

18 Claims, 9 Drawing Sheets

(56) References Cited

U.S. PATENT DOCUMENTS

| | | | |
|---|---|---|---|
| 6,111,198 A * | 8/2000 | Tower | H01L 21/50 174/135 |
| 6,423,575 B1 * | 7/2002 | Tran | H01L 23/26 438/115 |
| 6,680,544 B2 | 1/2004 | Lu et al. | |
| 6,841,731 B1 * | 1/2005 | Zanello | H01J 5/36 174/50.56 |
| 6,844,502 B2 * | 1/2005 | Deng | H01B 17/30 174/151 |
| 6,900,533 B2 | 5/2005 | Burton | |
| 7,444,734 B2 | 11/2008 | Gaucher et al. | |
| 7,732,913 B2 | 9/2010 | Hsieh et al. | |
| 7,968,978 B2 | 6/2011 | Adlerstein et al. | |
| 8,119,931 B1 | 2/2012 | Liu | |
| 8,153,449 B2 | 4/2012 | Adlerstein et al. | |
| 8,618,629 B2 | 12/2013 | Kim et al. | |
| 8,773,204 B2 | 7/2014 | Cabanillas et al. | |
| 9,059,490 B2 | 6/2015 | DeVries et al. | |
| 9,245,835 B1 | 1/2016 | Jiang et al. | |
| 9,437,558 B2 | 9/2016 | Pye et al. | |
| 9,577,416 B2 | 2/2017 | Nisslbeck et al. | |
| 9,666,544 B2 | 5/2017 | Zu et al. | |
| 9,812,379 B1 | 11/2017 | Chiu et al. | |
| 10,945,337 B2 * | 3/2021 | Ikeda | H05K 3/3447 |
| 2010/0232480 A1 | 9/2010 | Bhandal et al. | |
| 2011/0084358 A1 | 4/2011 | Kim et al. | |
| 2011/0223692 A1 | 9/2011 | Adlerstein et al. | |
| 2014/0300003 A1 | 10/2014 | Kariyazaki et al. | |
| 2015/0097633 A1 | 4/2015 | DeVries et al. | |
| 2016/0181211 A1 | 6/2016 | Kamgaing et al. | |
| 2016/0343653 A1 | 11/2016 | Huang et al. | |
| 2017/0179050 A1 | 6/2017 | Kariyazaki | |
| 2017/0268827 A1 | 9/2017 | Kaminski et al. | |
| 2018/0034421 A1 | 2/2018 | Abdo et al. | |
| 2018/0122747 A1 | 5/2018 | Sun et al. | |
| 2019/0371746 A1 | 12/2019 | Mahon et al. | |
| 2019/0371747 A1 | 12/2019 | Wilcox | |

OTHER PUBLICATIONS

Bessemoulin, A. et al., "A chip-scale packaged amplifier MMIC using broadband hot-via-transitions," 11th GAAS Symposium, Munich 2003, pp. 415-418.

Bessemoulin, A., "Design data for hot-via interconnects in chip scale packaged MMICs upto 110 GHz," 12th GAAS Symposium, Amsterdam 2004, pp. 495-498.

Bessemoulin, A. et al., "Hot-via interconnects: A step toward surface mount chip scale packaged MMICs up to 110 GHz," IEEE CSIC Digest, 2004, pp. 237-240.

Bessemoulin, A. et al., "Soldered hot-via E-band and W-band power amplifier MMICs for millimeter-wave chip scale packaging," IEEE, 2016, pp. 1-4.

Extended European Search Report issuedin EP Application No. 19176598.1, dated Oct. 4, 2019, 9 pages.

Kazior, T.E. et al., "DBIT—Direct Backside Interconnect Technology: A manufacturable, bond wire free interconnect technology for microwave and millimeter wave MMICs," IEEE MTT-S Digest, 1997, pp. 723-726.

Lin, H.T. et al., "6 inch 0.1 um GaAs pHEMT technology for E/V/ band application," CS MANTECH Conference, May 16-19, 2011, Palm Springs, CA, pp. 1-3.

Lin. S. et al., "Development of an ultra-wideband suspended stripline to shielded microstrip transition.," IEEE Microwave and Wireless Components Letters, Sep. 2011, vol. 21, No. 9. pp. 474-476.

Schmückle, F.J. et al., "40 GHz hot-via flip-chip interconnects," IEEE MTT-S Digest, 2003, pp. 1167-1170.

Stratix 10 Devices, High Speed Signal Interface Layout Design Guideline, Intel, Nov. 11, 2016, pp. 1-88.

Zhou, J. et al., "3D heterogeneous integration technology using hot via MMIC and silicon interposer with millimeter wave application," IEEE, 2017, pp. 499-502.

* cited by examiner

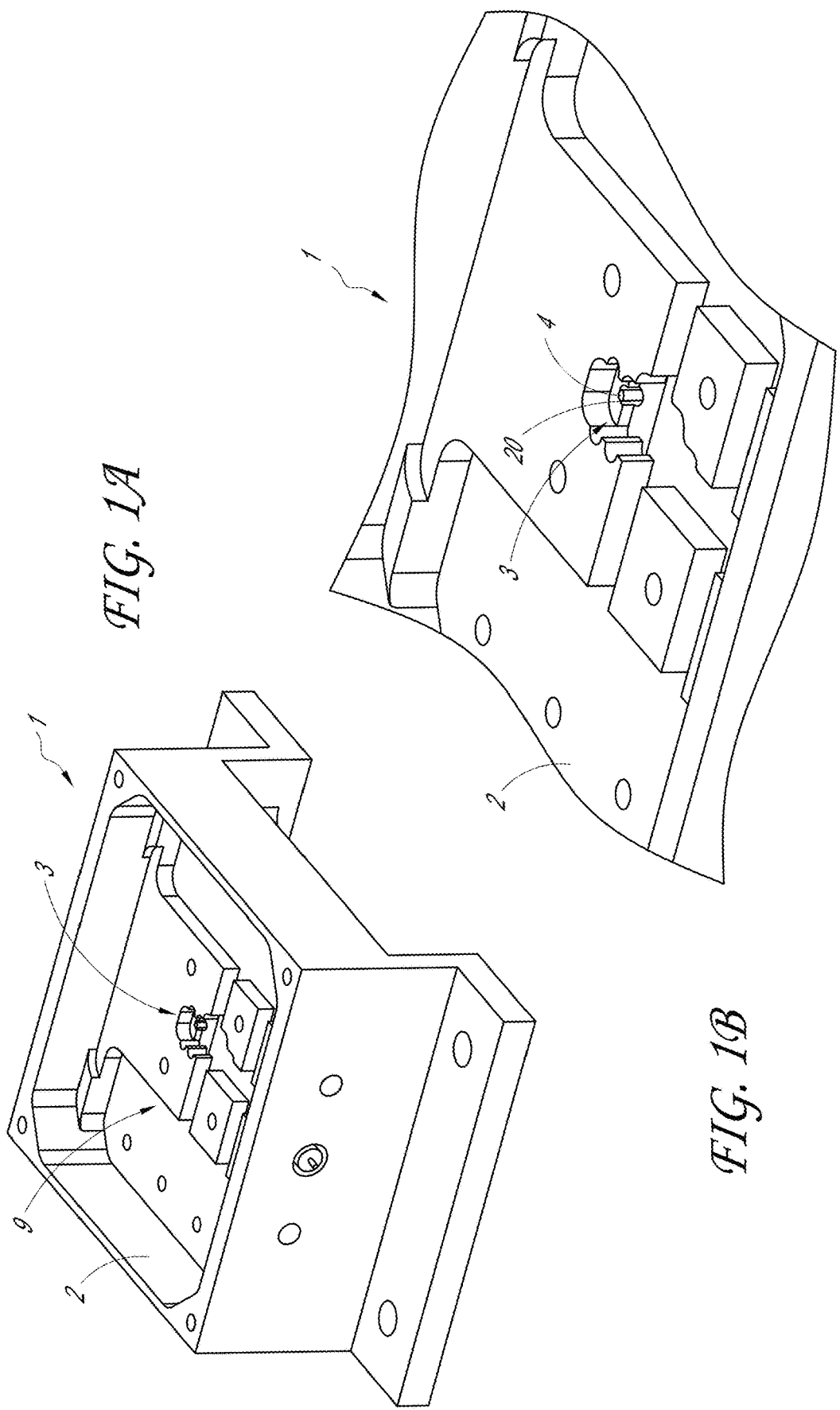

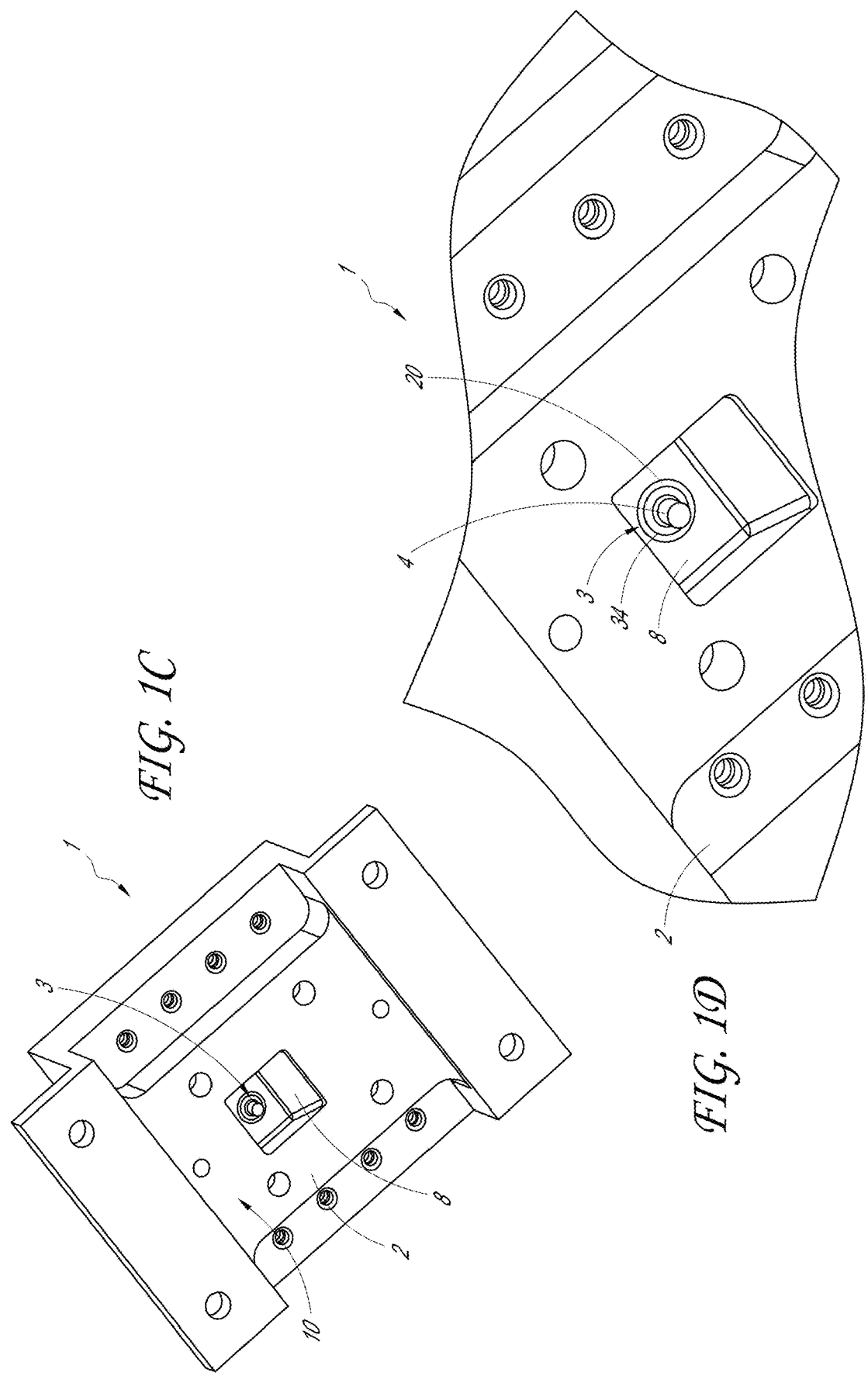

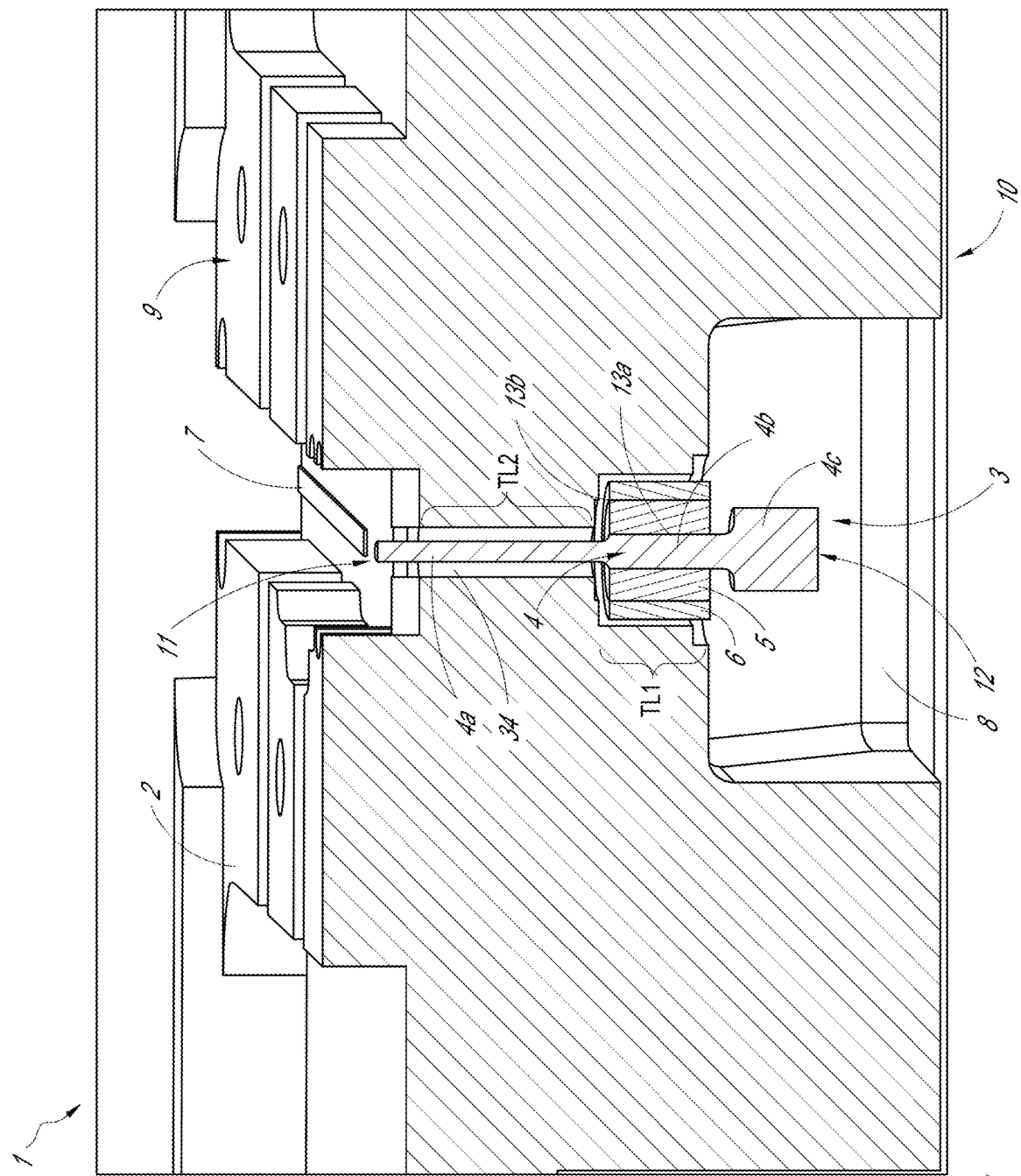

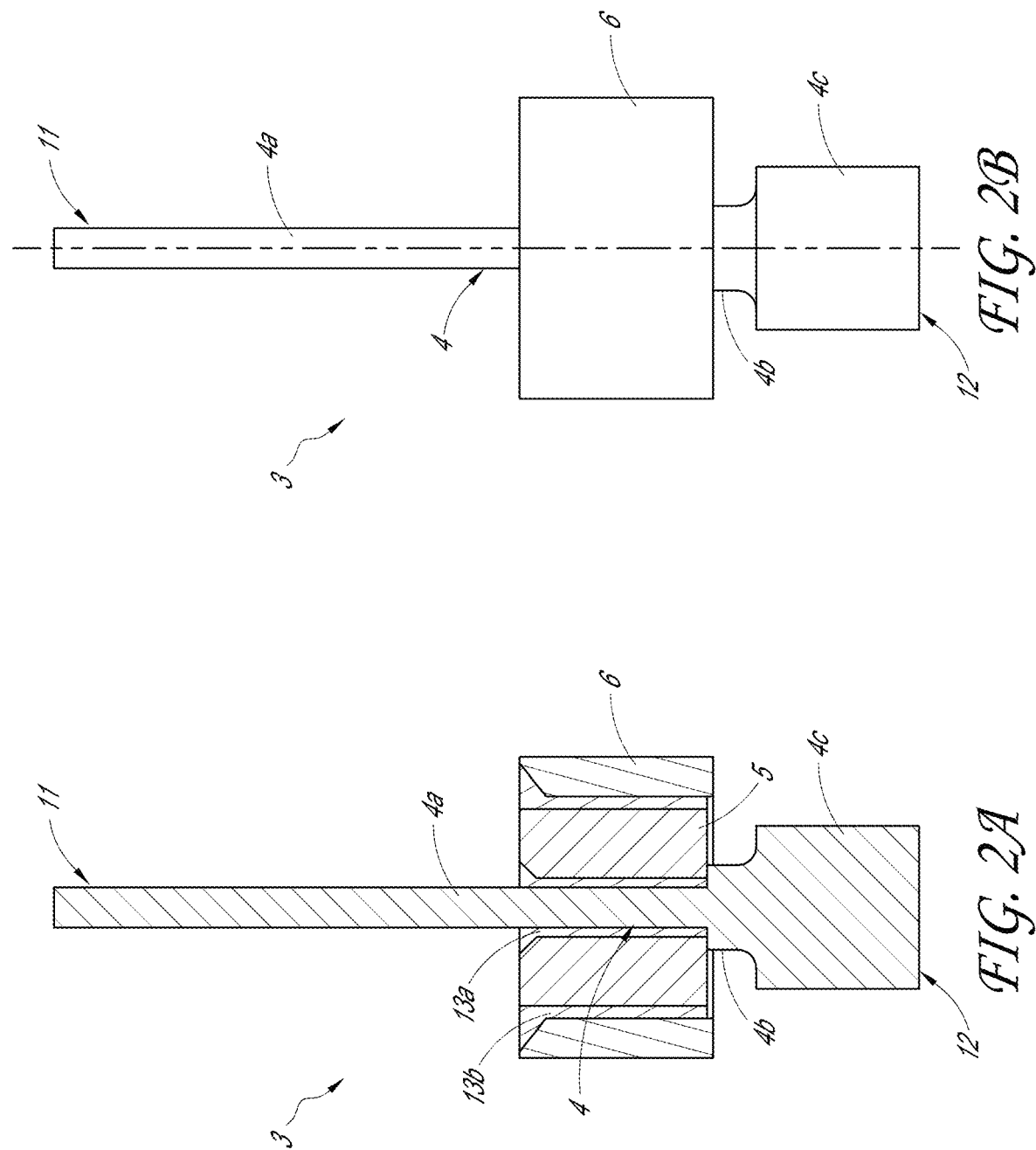

ELECTRICAL FEEDTHROUGH ASSEMBLY

CROSS-REFERENCE TO RELATED APPLICATIONS

This application claims priority to U.S. Provisional Patent Application No. 62/850,818, filed on May 21, 2019, the entire contents of which are incorporated by reference herein in their entirety and for all purposes.

BACKGROUND

Field

The field relates to an electrical feedthrough assembly and, in particular, to a compact, hermetic high-power ceramic-to-metal radio frequency (RF) feedthrough assembly.

Description of the Related Art

Electrical feedthrough assemblies provide electrical communication between a first side of an electronic device or partition and a second, opposite side of the electronic device or partition. It can be challenging to transfer high levels of electrical or radio frequency (RF) power at high frequencies without significant loss and without damaging the electrical feedthrough assembly or the electronic device. Moreover, it can be challenging to fabricate electrical feedthrough assemblies with dimensions sufficient to transfer electrical power at high frequencies. Accordingly, there remains a continuing need for improved electrical feedthrough assemblies.

SUMMARY

In one embodiment, an electrical feedthrough assembly is disclosed. The electrical feedthrough assembly can comprise an elongate conductor and a collar at least partially surrounding the elongate conductor along a portion of a length of the elongate conductor, the collar composed of a material having a thermal conductivity of at least 170 W/(m-K). At one or more operating frequencies, at least a portion of a length of the electrical feedthrough assembly can be selected to provide at least one quarter wave transform.

In some embodiments, the collar can comprise beryllium oxide (BeO). The elongate conductor can be composed of a nonferrous material. The elongate conductor can comprise copper. The elongate conductor can comprise a chromium copper alloy. An inner wall of the collar can be mechanically and thermally joined to the elongate conductor along the portion of the length of the elongate conductor. The elongate conductor and the collar can be brazed together with an intervening thermally conductive filler material. The filler material can comprise a copper silver alloy. The electrical feedthrough assembly can comprise a shell disposed about the collar, with the shell being configured to mount to an electronic module. The shell can comprise Kovar®. An outer wall of the collar can be mechanically and thermally joined to the shell. The filler metal can comprise a copper silver alloy. The electrical feedthrough assembly can be configured to transfer electrical signals along the elongate conductor having an input power of at least 50 W and a frequency of at least 18 GHz. The electrical feedthrough assembly can be configured to transfer electrical signals along the elongate conductor having an input power across a range of 100 W to 300 W and at frequencies across a range of 30 GHz to 300 GHz. At the one or more operating frequencies, the length of the electrical feedthrough assembly can be selected to provide at least two back-to-back quarter wave transforms. A length of the collar can be selected to provide at least one quarter wave transform. At least one of the length of the collar and a length of the elongate conductor can be selected to provide a second back-to-back quarter wave transform. A thermal conductivity of the collar can be in a range of 200 W/(m-K) to 330 W/(m-K). The thermal conductivity of the collar can be in a range of 225 W/(m-K) to 330 W/(m-K). The elongate conductor can be configured to serve as an E-plane probe.

In another embodiment, an electrical feedthrough assembly is disclosed. The electrical feedthrough assembly can comprise an elongate conductor composed of a nonferrous material and a thermally conductive, dielectric collar at least partially surrounding the elongate conductor along a portion of a length of the elongate conductor, an inner wall of the collar mechanically and thermally joined to the portion of the length of the elongate conductor.

In some embodiments, the collar can be composed of a material having a thermal conductivity of at least 170 W/(m-K). A shell can be disposed about the collar, the shell configured to mechanically mount the collar and the conductor to a support structure of an electronic module. The elongate conductor can be configured to serve as an E-plane probe.

In another embodiment an electrical feedthrough assembly is disclosed. The electrical feedthrough assembly can comprise an elongate conductor and a collar at least partially surrounding the elongate conductor along a portion of a length of the elongate conductor. At one or more operating frequencies, at least a portion of a length of the electrical feedthrough assembly can be selected to provide at least one quarter wave transform.

In some embodiments, the elongate conductor can be composed of a nonferrous material. The collar can be composed of a material having a thermal conductivity of at least 200 W/(m-K). An inner wall of the collar can be mechanically and thermally joined to the elongate conductor along the portion of the length of the elongate conductor.

In another embodiment, an electronic module is disclosed. The electronic module can include a support structure having a first side and a second side opposite the first side. The electronic module can include a conductor extending through an aperture of the support structure, the conductor having a first end to provide electrical communication to the first side and a second end to provide electrical communication to the second side, the conductor composed of a nonferrous material. The electronic module can include a thermally conductive, dielectric collar at least partially surrounding the conductor along a portion of a length of the conductor.

In some embodiments, the conductor can comprise a copper alloy and the collar can comprise beryllium oxide (BeO). The electronic module can comprise a shell disposed about the collar, the shell mechanically mounting the collar and the conductor to the support structure. The shell can comprise Kovar®. The collar and the shell can be brazed together with a first intervening filler metal, and the collar and the conductor can be brazed together with a second intervening filler metal.

BRIEF DESCRIPTION OF THE DRAWINGS

FIG. 1A is a schematic top perspective view of an electronic module, according to various embodiments.

FIG. 1B is a magnified view of the electronic module shown in FIG. 1A.

FIG. 1C is a schematic bottom perspective view of the electronic module shown in FIG. 1A.

FIG. 1D is a magnified view of the electronic module shown in FIG. 1C.

FIG. 1E is a side sectional view of the electronic module of FIGS. 1A-1D.

FIG. 2A is a side sectional view of a feedthrough assembly, according to various embodiments.

FIG. 2B is a side plan view of the feedthrough assembly of FIG. 2A.

DETAILED DESCRIPTION

Figure 1F:
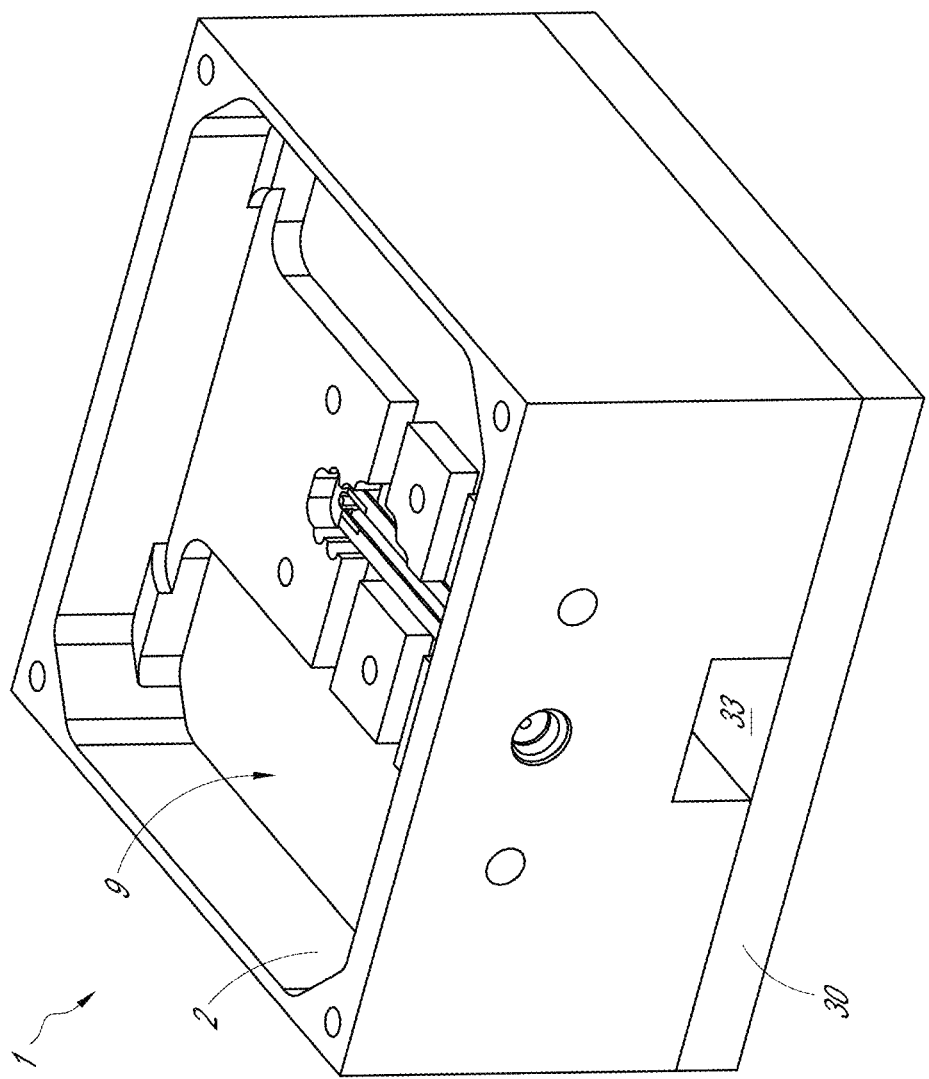
FIG. 1F is a schematic perspective view of an electronic module according to various embodiments.

Various embodiments disclosed herein relate to electrical feedthrough assemblies that can operate at high electrical powers and/or at high frequencies, e.g., high power radio frequency (RF) transmissions at millimeter-wave frequency bands. Moreover, the electrical feedthrough assemblies disclosed herein can operate in challenging environmental conditions, in which it may be important to hermetically seal one end of the feedthrough assembly from the opposite end of the feedthrough assembly. For example, in aerospace applications, it may be important to seal one end of the feedthrough assembly from moisture, temperatures that are too high or too low, pressures that are too high or too low, or any other suitable conditions. The embodiments disclosed herein provide such a hermetic (or near-hermetic) seal between first and second end portions of an electrical feedthrough assembly. Furthermore, the embodiments disclosed herein enable the feedthrough assembly to be packaged within a compact profile, so as to enable the larger electronic device to be made smaller.

FIGS. 1A-1E illustrates an example of an electronic module 1 having an electrical feedthrough assembly 3, according to one embodiment. In particular, FIG. 1A is a schematic top perspective view of the electronic module 1. FIG. 1B is a magnified view of the electronic module 1 shown in FIG. 1A. FIG. 1C is a schematic bottom perspective view of the electronic module 1 shown in FIG. 1A. FIG. 1D is a magnified view of the electronic module 1 shown in FIG. 1C. The electronic module 1 can comprise a support structure 2 having a first side 9 and a second side 10 opposite the first side 9. In the example of FIGS. 1A-1E, the electronic module 1 comprises a testing apparatus for testing various electrical circuits and chips (not shown) mounted to the support structure 2. It should be appreciated, however, that the electronic module 1 can comprise any suitable type of electronic module 1. The support structure 2 can comprise any suitable type of material, such as a metal or insulator. The support structure 2 can serve as a partition between the first and second sides 9, 10.

The first side 9 of the electronic module 1 can include electronic components such as any suitable number and/or type of electronic modules, integrated circuitry, chips (integrated device dies, such as integrated circuit dies), transmission lines, printed card assemblies, passive electronic devices, etc., which are not shown in FIGS. 1A-1D for ease of illustration. The electronic components at the first side 9 of the module 1 can electrically connect to an elongate conductor 4 of the electrical feedthrough assembly 3 at the first side 9 of the module 1, for example, by way of wires, ribbon interconnects, solder, etc. (See FIG. 1E). The elongate conductor 4 can extend through an aperture 20 that passes through the support structure 2 from the first side 9 to the second side 10. As shown in FIGS. 1D-1F, the aperture 20 and the conductor 4 can be shaped such that there is an air gap 34 between the elongate conductor 4 and side walls of the support structure 2. The elongate conductor 4 can provide electrical communication between the first and second sides 9, 10 of the module 1. As shown in FIGS. 1C-1D, the second side 10 of the module 1 can include a waveguide portion 8 configured to transmit and/or receive electromagnetic signals between the elongate conductor 4 and other external devices. The feedthrough assembly 3 shown in FIGS. 1A-1D can serve as an E-plane probe (e.g., an orthogonal transition probe) to transmit or receive electromagnetic radiation into the waveguide portion 8. In other embodiments, however, the feedthrough assembly 3 can be shaped to serve as an H-plane probe (e.g., an in-plane transition probe) in other embodiments.

FIG. 1E is a side sectional view of the electronic module 1 of FIGS. 1A-1D. As shown in FIG. 1E, the elongate conductor 4 can have a first end 11 and a second end 12 opposite the first end 11. The first end 11 of the elongate conductor 4 can provide electrical communication to components on the first side 9 of the support structure 2. For example, as shown in FIG. 1E, the first end 11 of the elongate conductor 4 can electrically connect to one or more transmission lines 7 (which may comprise a ceramic microstrip RF line) by way of a connector such as a ribbon interconnect or solder connection (not shown). Additional electronic components, such as electronic circuitry, integrated device dies or chips, printed card assemblies, passive devices, etc. may connect to the transmission lines 7 and to the larger electronic system. As explained above, and as shown in FIGS. 1C-1E, the second end 12 of the elongate conductor 4 can provide electrical communication to the second side 10 of the support structure 2, e.g., to serve as an electromagnetic probe to the waveguide portion 8.

In the embodiment of FIG. 1E, the elongate conductor 4 can comprise a first pin portion 4a, a second necked portion 4b wider than the first portion 4a, and a third bell portion 4c wider than the second portion 4b. The first, second, and third portions 4a-4c can be integrally formed in various embodiments. The first pin portion 4a can serve to electrically connect to the transmission line 7, and the third bell portion 4c can serve as the RF probe. The second necked portion 4b can serve as a transition between the first and third portions 4a, 4c. Beneficially, the elongate conductor 4 can be composed of a nonferrous material. For example, in some embodiments, the elongate conductor 4 can comprise copper, such as a chromium copper (CrCu) alloy. As compared with ferrous materials, the use of a nonferrous material can provide improved thermal and electrical conductivity, which improves performance and reduces losses at high electrical power and high RF band frequencies. Moreover, the diameter (or major lateral dimension) can be sized to be sufficiently small so as to improve high frequency performance. It should be appreciated that the elongate conductor 4 can be structured differently in some embodiments. For example, the elongate conductor 4 of FIG. 2A can be used in the embodiment of FIGS. 1A-1E.

A thermally conductive, dielectric collar 5 can at least partially surround the elongate conductor 4 along a portion of a length of the elongate conductor 4. In FIG. 1E, for example, the dielectric collar 5 is disposed about a portion of the necked portion 4b of the conductor 4. In some embodiments, the collar 5 can be disposed around other portions of the conductor 4 such as the first pin region 4a of the conductor 4 shown in FIG. 2A. As shown, the necked portion 4b can be mechanically and thermally connected (e.g., joined) along the length of the inner diameter (e.g., an inner wall) of the dielectric collar 5. For example, the necked portion 4b and the inner diameter of the collar 5 can be brazed together or otherwise physically joined to mechanically secure the elongate conductor 4 to the collar 5 and to enhance heat dissipation radially outward from the elongate conductor 4 to the collar 5. The length of the brazed connection between the conductor 4 and collar 5 can be adjusted to provide for desired heat transfer. For example, the brazed connection can be made longer to increase the amount of heat transfer, which can improve the power handling capability of the structure. In various embodiments, the brazed connection can form a hermetic or near-hermetic seal. As explained below, the brazed connection can be formed using a highly thermally conductive filler material 13a between the conductor 4 and collar 5.

It is desirable to transfer high electrical power at high frequencies, while ensuring adequate heat dissipation so as to avoid damage to the electrical feedthrough assembly 3 and the module 1. In the embodiment of FIG. 1E, the collar 5 can comprise a dielectric material having a very high thermal conductivity and that can be securely connected to the elongate conductor 4 to provide a thermally conductive, radially outward heat dissipation pathway. For example, in the illustrated embodiment, the collar 5 can have a thermal conductivity of at least 170 W/(m-K), at least 200 W/(m-K), or at least 230 W/(m-K). The collar 5 can be formed of a material having a thermal conductivity in a range of 170 W/(m-K) to 1100 W/(m-K), in a range of 200 W/(m-K) to 1050 W/(m-K), in a range of 200 W/(m-K) to 350 W/(m-K), or in a range of 210 W/(m-K) to 330 W/(m-K), e.g., in a range of 225 W/(m-K) to 330 W/(m-K). In one example, the thermal conductivity of the collar 5 can be about 285 W/(m-K). As an example, the collar 5 can be formed of beryllium oxide (BeO), which can beneficially serve as an electrical insulator with a low electrical permittivity, a low loss tangent, and a high thermal conductivity. In other embodiments, diamond can be used for the collar 5. In other embodiments, different dielectric materials having these properties may be used for the collar 5, however, the high frequency performance may diminish relative to equivalently sized collars that use high thermal conductivity dielectrics. In other embodiments (e.g., relatively low power applications), the collar 5 may have a lower thermal conductivity and may include any suitable ceramic, such as aluminum nitride (AlN), alumina ($Al_2O_3$), borosilicate glass, etc.

A shell 6 can be disposed about the collar 5 to mount the collar 5 and the conductor 4 to the electronic module 1. The shell 6 can connect to the support structure 2 so as to create a hermetic or near hermetic seal between the first and second sides 9, 10 of the support structure 2. The shell 6 can comprise a conductor, such as a metal. In various embodiments, the shell 6 can include an alloy that includes nickel, iron, and cobalt, such as Kovar®. The shell 6 can further conduct heat away from the elongate conductor 4 and the collar 5 (e.g., radially outward), while providing a mechanical connection and seal to the support structure 2. As shown in FIG. 1E, the elongate conductor 4 and the collar 5 can be brazed together with an intervening thermally conductive filler material (e.g., a filler metal 13a) to form a sealed mechanical and thermal connection having a high thermal conductivity. As shown the filler metal 13a can extend along the length of the inner diameter of the collar 5. In other embodiments, the filler metal 13a can extend along at least 50%, at least 75%, or at least 95% of the length of the inner diameter of the collar 5. Any suitable thermal conductor can be used for the filler material 13a. In the embodiment of FIG. 1E, the filler metal 13a for brazing can comprise a copper silver alloy, such as CuSil™. Beneficially, in some embodiments, the filler 13a can comprise a highly thermally conductive material that improves radial heat transfer which increases the power handling capabilities of the assembly.

Similarly, in FIG. 1E, the shell 6 and the collar 5 can be brazed together with an intervening thermally conductive filler material (e.g., a filler metal 13b) to form a sealed mechanical connection having a high thermal conductivity. As shown, for example, the filler metal 13b can extend along a length of the inner diameter of the shell 6 (and along the outer diameter of the collar 5). In other embodiments, the filler metal 13b can extend along at least 50%, at least 75%, or at least 95% of the length of the inner diameter of the shell 6. In some embodiments, the elongate conductor 4, the collar 5, and the shell 6 can be brazed at the same time or during the same brazing procedure. The filler metal 13b may also comprise a copper silver alloy, such as CuSil. In other embodiments, the filler metals 13a, 13b can comprise a gold tin alloy.

The feedthrough assembly 3 can be mechanically connected to the support structure 2 in any suitable manner to form the hermetic or near-hermetic seal. For example, in some embodiments, the feedthrough assembly 3 can be soldered to an inside wall of the aperture 20 of the support structure 2, e.g., using a gold-tin solder composition or other solder composition. In various embodiments, the solder that connects the feedthrough assembly 3 to the support structure 2 can have a reflow temperature that is lower than the reflow temperatures of the filler material 13a, 13b, so that the integration of the feedthrough assembly 3 with the support structure 2 does not affect the structural integrity of the brazed connection between the elongate connector 4 and the collar 5, and/or between the collar 5 and the shell 6.

Figure 1G:
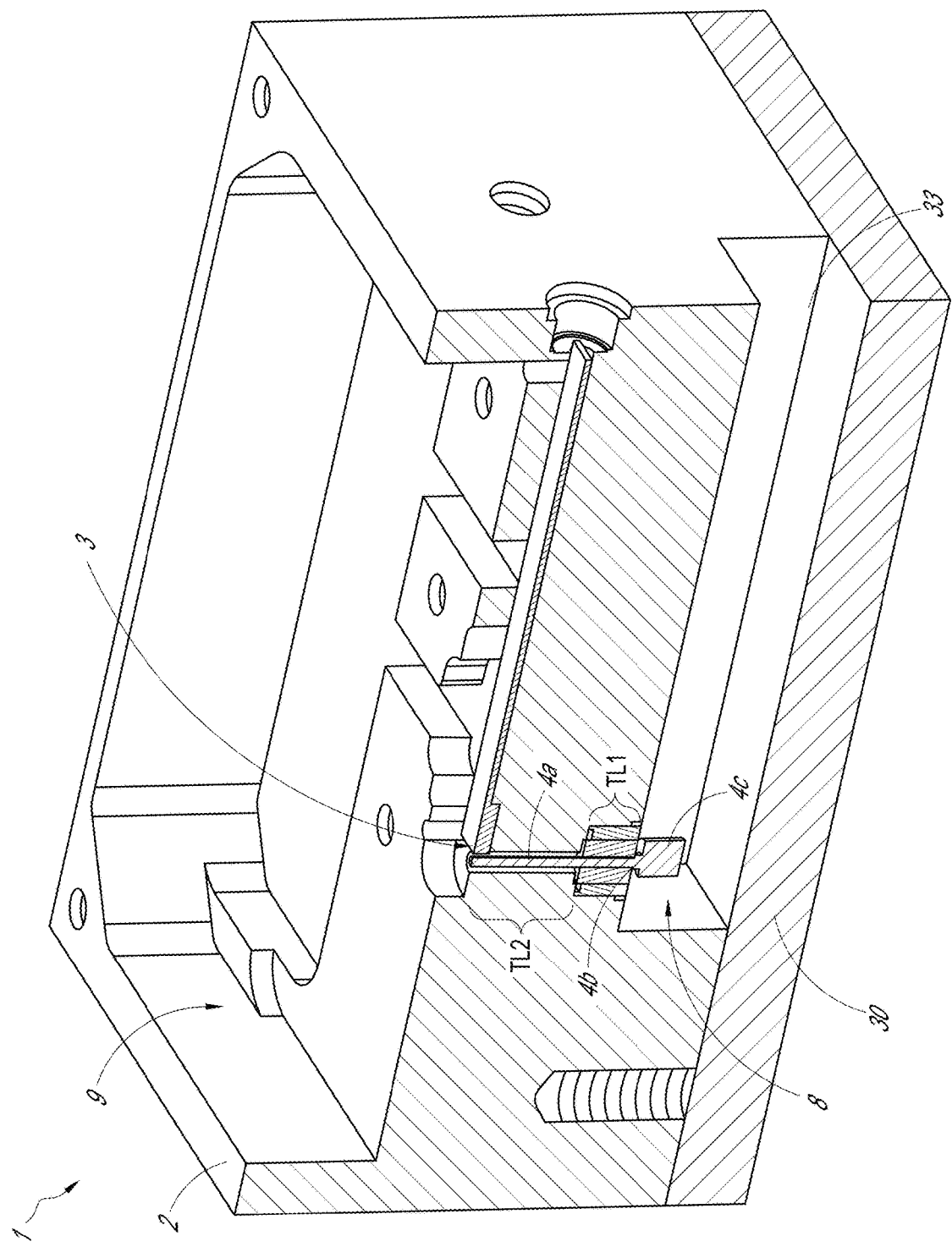
FIG. 1G is a schematic perspective sectional view of the electronic module of FIG. 1F.

FIG. 1F is a schematic perspective view of an electronic module 1 according to various embodiments. FIG. 1G is a schematic perspective sectional view of the electronic module 1 of FIG. 1F, joined with a cover 30 to form an electrical feedthrough assembly. In various embodiments, for example, the cover 30 and feedthrough assembly 3 can comprise a waveguide-to-coaxial ("coax") transition (e.g., an E-plane waveguide-to-coaxial transition in FIGS. 1F-1G). The embodiment of FIGS. 1F-1G includes the conductor 4 shown in FIGS. 2A-2B. As shown in FIG. 1G, the cover 30 can form a cavity 33 that serves as a waveguide 8. When the cover 30 is mated or mechanically joined with the support structure 2, electromagnetic waves can propagate along the waveguide 8. For example, electromagnetic waves can propagate along the waveguide 8 through the cavity 33 and can be received by the feedthrough assembly 3. For example, the electromagnetic waves can be received by the bell portion 4c of the elongate conductor 4, which can serve as an antenna. As shown in FIGS. 1E and 1G, a first coaxial transmission line TL1 having a first impedance can be defined by the shell 6, collar 5, and the axial portion of the elongate conductor 4 that is connected to the collar 5. A second coaxial transmission line TL2 having a second impedance can be defined above the first line TL1 by the elongate conductor 4, the air gap 34, and the support structure 2 (which can comprise a metal). Signals can propagate upwardly along the first and second transmission lines TL1, TL2, and can be transmitted to the trace 7 by way of an electrical connector as explained above.

Figure 3B:
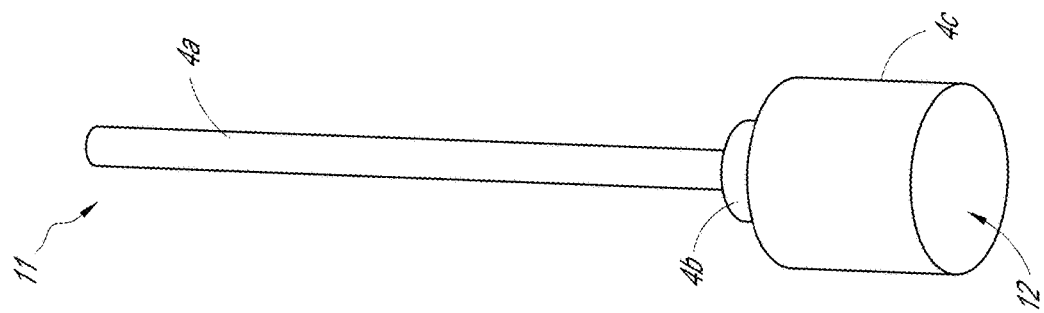
FIG. 3B is a bottom schematic perspective view of the elongate conductor of FIG. 3A.
Figure 3A:
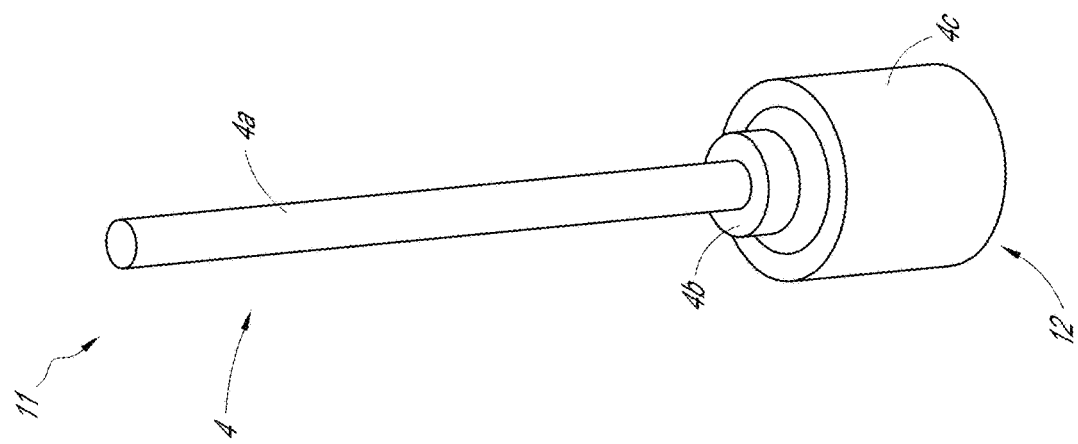
FIG. 3A is a top schematic perspective view of the elongate conductor used with the feedthrough assembly of FIGS. 2A-2B.
Figure 4B:
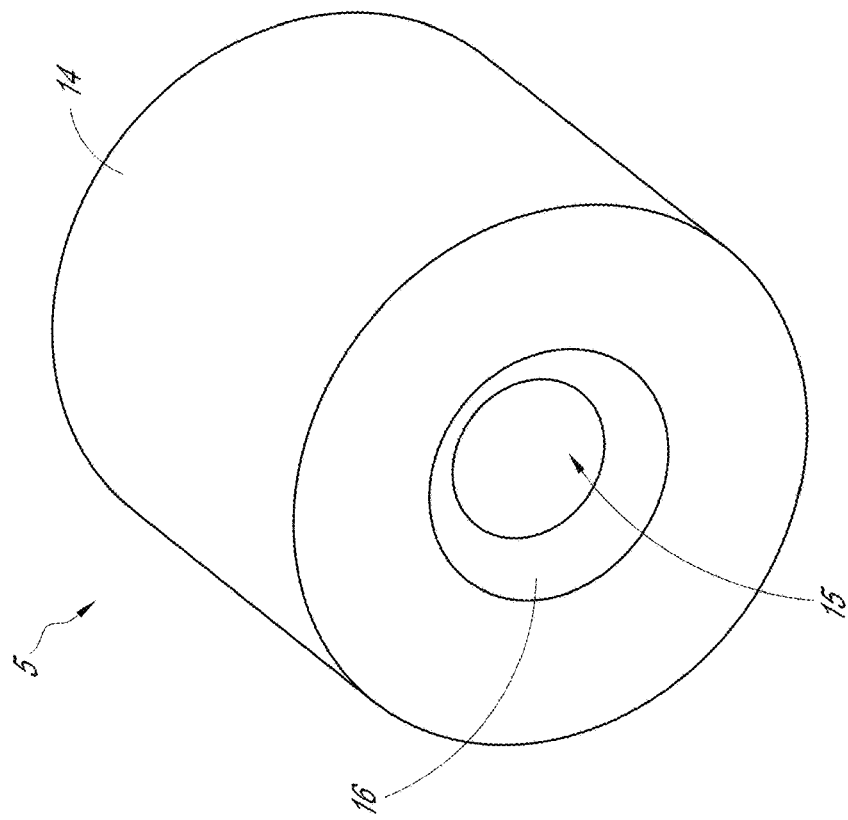
FIG. 4B is a bottom schematic perspective view of the collar of FIG. 4A.
Figure 4A:
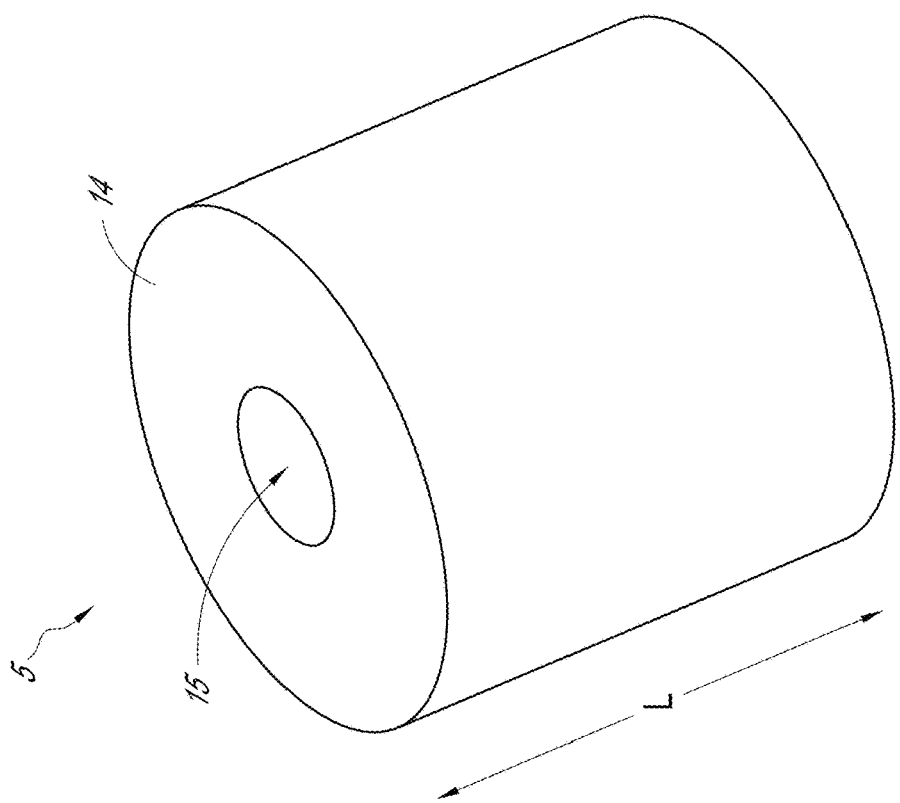
FIG. 4A is a top schematic perspective view of the collar used with the feedthrough assembly of FIGS. 2A-2B.
Figure 5B:
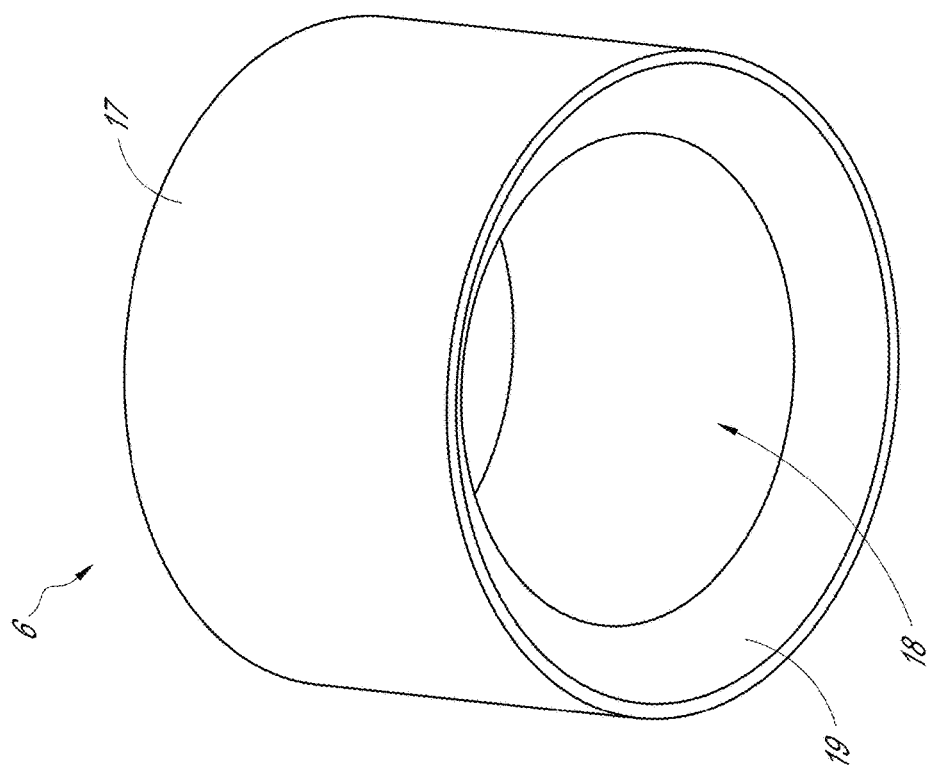
FIG. 5B is a bottom schematic perspective view of the shell of FIG. 5A.
Figure 5A:
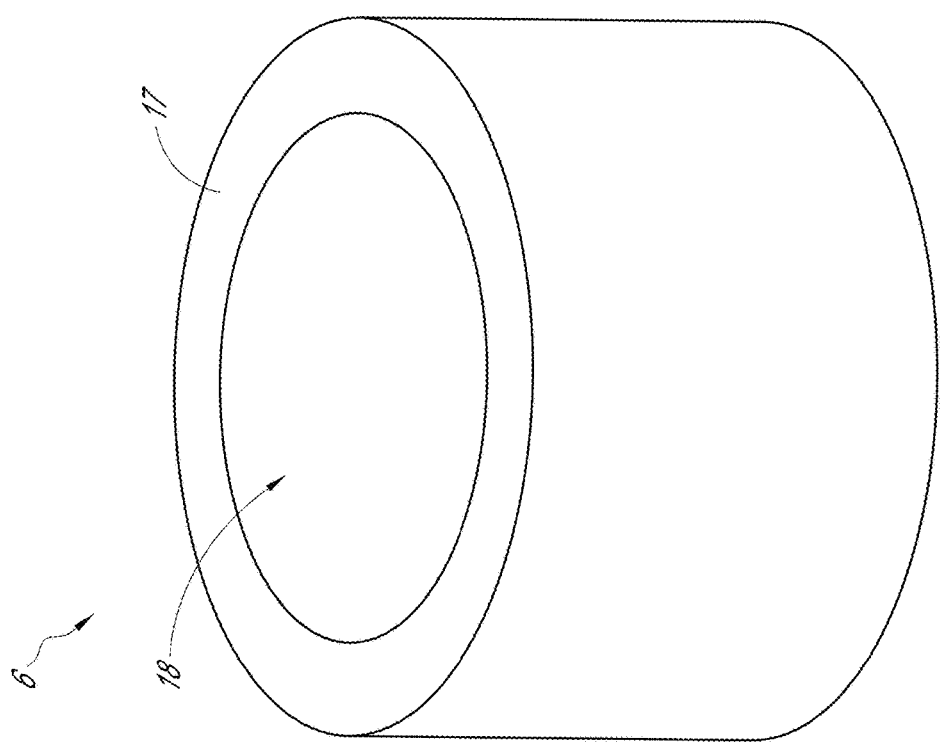
FIG. 5A is a top schematic perspective view of the shell used with the feedthrough assembly of FIGS. 2A-2B.

FIG. 2A is a side sectional view of a feedthrough assembly 3, according to various embodiments. FIG. 2B is a side plan view of the feedthrough assembly 3. Unless otherwise noted, the components of the feedthrough assembly 3 of FIGS. 2A-2B may be the same as or generally similar to like-numbered components of FIGS. 1A-1E. For example, FIG. 3A is a top schematic perspective view of the elongate conductor 4 used with the feedthrough assembly 3 of FIGS. 2A-2B. FIG. 3B is a bottom schematic perspective view of the elongate conductor 4 of FIG. 3A. FIG. 4A is a top schematic perspective view of the collar 5 used with the feedthrough assembly 3 of FIGS. 2A-2B. FIG. 4B is a bottom schematic perspective view of the collar 5 of FIG. 4A. FIG. 5A is a top schematic perspective view of the shell 6 used with the feedthrough assembly 3 of FIGS. 2A-2B. FIG. 5B is a bottom schematic perspective view of the shell 6 of FIG. 5A.

The feedthrough assembly 3 of FIGS. 2A-2B is constructed in a generally similar manner as the assembly 3 of FIGS. 1A-1E. Unlike the embodiment of FIGS. 1A-1E, as shown in FIGS. 2A-3B, the portions 4a-4c of the elongate conductor 4 are provided along different regions of the conductor 4. For example, the second necked region 4b may be provided outside, e.g., below, the collar 5 (see also FIG. 1G). In various embodiments, the second necked region 4b may have approximately the same length as the collar 5. Thus, in FIGS. 2A-2B, the first pin region 4a may extend through the aperture 20 of the support structure 2. In various embodiments, the diameters of major dimension of portion 4c can be larger than the diameter of portion 4b, and the diameter of portion 4b can be larger than the diameter of portion 4a. In still other embodiments, the diameters of portions 4a-4c may be approximately the same. In still other embodiments, the diameter of portion 4c can be smaller than the diameter of portion 4b, and the diameter of portion 4b can be smaller than the diameter of portion 4a. In still other embodiments, the diameter of the elongate conductor 4 that is disposed along and within the collar 5 may have a diameter that differs from the respective diameters of the portions 4a, 4b, and/or 4c shown in FIGS. 2A-2B. Still other combinations may be suitable.

The collar 5 of FIGS. 2A-2B and 4A-4B may be generally similar in material and construction as the collar 5 of FIGS. 1A-1E. For example, the collar 5 can comprise a highly thermally conductive dielectric material, such as BeO. In other embodiments, however, any suitable ceramic can be used for the collar 5, such as AN, diamond, etc. The collar 5 can include a collar body 14 having a collar opening 15 therethrough. Moreover, the bottom side of the collar 5 can include a flared surface 16 angled relative to the inner diameter of the collar 5 so as to connect to the third portion 4c of the conductor 4. The flared surface 16 can serve as a braze well that enables brazing material (e.g., filler 13a) to pool before flowing down the length of the elongate conductor 4 along the inner diameter of the collar 5 to create the hermetic or near-hermetic seal. The flared surface 16 can beneficially reduce the likelihood of the filling material 13a flowing over and contacting the filling material 13b. The first pin portion 4a of the conductor 4 can be inserted into the collar opening 15. As explained above, the first pin portion 4a can be mechanically and thermally joined (e.g., brazed) to the inner wall (e.g., inner diameter) of the collar 5 (e.g., an inner wall of the collar opening 15), e.g., with a copper silver joining material. Likewise, the shell 6 of FIGS. 2A-2B and 5A-5B may be generally similar in material and construction as the shell 6 of FIGS. 1A-1E. The shell 6 can comprise a conductive material, such as Kovar®. The shell 6 can include a shell body 17 having a shell opening 18 therethrough. The shell opening 18 can be sized to receive the outer diameter of the collar 5. As explained above, the outer wall of the collar 5 can be mechanically and thermally joined (e.g., brazed) to the inner wall of the shell 6 (e.g., the inner wall of the shell opening 18), e.g., with a copper silver joining material. The shell 6 can also include an outwardly tapered surface 19.

The electrical feedthrough assemblies 3 shown in FIGS. 1A-2B can beneficially provide high power, high frequency RF transmissions with low losses and without damaging the assemblies 3 or the electronic module 1. Beneficially, the embodiments of FIGS. 1A-5B can be configured to transfer electrical signals along the elongate conductor 4 having an input power of at least 50 W (continuous wave, or CW) and a frequency of at least 18 GHz, or at least 30 GHz. In various embodiments, for example, the electrical feedthrough can be configured to transfer electrical signals along the elongate conductor 4 having an input power across a range of 50 W to 300 W (e.g., CW input power), or in a range of 100 W to 300 W (e.g., CW input power), and at frequencies across a range of 30 GHz to 300 GHz, for example, at frequencies across a range of 30 GHz to 135 GHz. The feedthrough assemblies 3 can operate in either pulsed or continuous wave (CW) mode, or both.

The transmission of high electrical power at high frequencies generates a substantial amount of heat that may damage various types of materials used in other types of feedthroughs. Beneficially, the embodiments disclosed herein enable a highly efficient transfer of thermal energy radially outward from the conductor 4. For example, the use of CrCu for the conductor 4 can enhance thermal dissipation to the collar 5 by way of the thermally conductive filler 13a. The use of a high thermal conductivity dielectric such as BeO can improve the transfer of heat from the conductor 4 to the shell 6, as compared with other dielectric materials such as glass (e.g., borosilicate glass) or aluminum oxide. The thermally conductive shell 6, which can comprise Kovar®, can provide an additional thermally efficient pathway to the support structure 2 or a heat sink by way of the intervening thermally conductive filler 13b.

To provide high power transmission at high frequencies with minimal loss, the respective diameters of the conductor 4, the collar 5, and the shell 6 can be selected accordingly. For example, the respective diameters of the elongate conductor 4, the collar 5, and the shell 6 can be selected to pass the desired transverse electromagnetic (TEM) mode, but cutoff the first higher order transverse electric (TE) mode so as to avoid degradation of Voltage Standing Wave Ratio (VSWR) and reduce loss. To improve the cutoff capabilities of the TE mode, the characteristic impedance of the coaxial transmission line created by the elongate conductor 4, the collar 5, and the shell 6 can be less than the standard characteristic impedance of other coaxial structures and RF systems (e.g., other 50Ω impedance systems). In various embodiments, the diameter of the first portion 4a can be in a range of 5 mil to 50 mil (with "mil" corresponding to 0.001 inches), in a range of 6 mil to 20 mil, in a range of 8 mil to 18 mil, in a range of 10 mil to 16 mil, or in a range of 10 mil to 14 mil (for example, about 12 mil in some embodiments).

Furthermore, the embodiments disclosed herein can ensure adequate impedance matching between the feedthrough assembly 3 and the transmission line(s) 7 or other structures of the electronic module 1 to which it will be connected. For example, at one or more operating frequencies (including those described above), the transmission line 7 can have an associated impedance (e.g., about 50Ω in some embodiments), which can be matched to the second impedance of the second coaxial transmission line TL2 (see FIGS. 1E and 1G) defined at least in part by the inner side wall of the support structure 2, the first portion 4a of the elongate conductor, and the intervening air gap 34. Thus, the diameter or width of the aperture 20, the diameter or width of the elongate conductor, the selection of respective materials for the support structure 2 and conductor 4, and/or other parameters can be selected so as to define the second coaxial transmission line TL2 with an impedance that substantially matches that of the transmission line 7.

The feedthrough assembly 3 can define at least in part the first coaxial transmission line TL1 (see FIGS. 1E and 1G) disposed below the second coaxial transmission line TL2 and having the first impedance. The first coaxial transmission line TL1 can comprise a portion of the feedthrough assembly 3 axially aligned with the collar 5 and shell 6 (e.g., a portion of the conductor 4 axially aligned with the collar 5, the collar 5, and the shell 6) can be dimensioned such that the second impedance of the second coaxial transmission line TL2 defined by the support structure 2, the air gap 34, and the conductor 4, substantially matches the first impedance of the first transmission line TL1 defined by the portion of the feedthrough assembly 3 that includes the collar 5 and shell 6 in order to reduce electrical losses.

In addition, at one or more operating frequencies, respective lengths of the first and second coaxial transmission lines TL1, TL2 can be selected to provide at least one quarter wave transform, for example, at least two back-to-back quarter wave transforms. In some embodiments, as explained above, the lengths of the transmission lines TL1, TL2 can be selected to match the impedance of the transmission line 7. The impedance of the transmission line 7 can have any suitable value, e.g., about 50 ohms in some embodiments. In some embodiments, the length of the second transmission line TL2 can be any suitable length, but the length of the first transmission line TL1 (e.g., a length L of the collar 5 (see FIG. 4A)) can be selected to provide at least one quarter wave transform (e.g., a back-to-back quarter wave transform that includes at least two quarter wave transforms) to substantially match the impedance of the second transmission line TL2 (which is matched to the transmission line 7), to increase cutoff frequency, and to reduce the overall size of the feedthrough assembly 3. In various embodiments, the lengths of both the first and second transmission lines TL1, TL2 can be selected to each provide at least one quarter wave transform (e.g., a back-to-back quarter wave transform that includes at least two quarter wave transforms) at the one or more operating frequencies. In some embodiments, the length of the first transmission line TL1 can be any suitable length, but the length of the second transmission line TL2 can be selected to provide at least one quarter wave transform (e.g., a back-to-back quarter wave transform that includes at least two quarter wave transforms). In some embodiments, the feedthrough assembly 3 can include more than one back-to-back quarter wave transforms. For example, the length of the first transmission line TL1 can be selected to provide back-to-back quarter wave transforms, and the length of the second transmission line TL2 can also be selected to provide back-to-back quarter wave transforms at the one or more operating frequencies.

As explained above, in some embodiments, the length L of the collar 5 can correspond to the length of the first coaxial transmission line TL1 and can be selected to be approximately one quarter the wavelength of the signal to be transmitted through the feedthrough assembly 3. In other embodiments the length L of the collar 5 corresponds to the first coaxial transmission line TL1 and can be selected to provide back-to-back quarter wave transforms. The length of the second transmission line TL2 can be selected to provide an additional quarter wave transform or back-to-back quarter wave transforms. In various embodiments, for example, the length L of the collar 5 can be in a range of 5 mil to 100 mil, in a range of 5 mil to 60 mil, in a range of 40 mil to 80 mil, in a range of 20 mil to 40 mil, or in a range of 25 mil to 35 mil.

Although disclosed in the context of certain embodiments and examples, it will be understood by those skilled in the art that the present invention extends beyond the specifically disclosed embodiments to other alternative embodiments and/or uses and obvious modifications and equivalents thereof. Further, unless otherwise noted, the components of an illustration may be the same as or generally similar to like-numbered components of one or more different illustrations. In addition, while several variations have been shown and described in detail, other modifications such as inclusion of additional coaxial transmission line sections, which are within the scope of this disclosure, will be readily apparent to those of skill in the art based upon this disclosure. It is also contemplated that various combinations or sub-combinations of the specific features and aspects of the embodiments may be made and still fall within the scope of the present disclosure. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the aspects that follow.

What is claimed is:

1. An electrical feedthrough assembly comprising:
    an elongate conductor;
    a collar at least partially surrounding the elongate conductor along a portion of a length of the elongate conductor, the collar composed of a material having a thermal conductivity of at least 170 W/(m-K); and
    a layer of conductive filler material disposed between an inner wall of the collar and the elongate conductor, the layer of conductive filler material mechanically and thermally connecting the inner wall of the collar to the elongate conductor along the portion of the length of the elongate conductor,
    wherein, at one or more operating frequencies, at least a portion of a length of the electrical feedthrough assembly is selected to provide at least one quarter wave transform.

2. The electrical feedthrough assembly of claim 1, wherein the collar comprises beryllium oxide (BeO).

3. The electrical feedthrough assembly of claim 1, wherein the elongate conductor is composed of a nonferrous material.

4. The electrical feedthrough assembly of claim 3, wherein the elongate conductor comprises copper.

5. The electrical feedthrough assembly of claim 1, wherein the elongate conductor and the collar are brazed together with the intervening thermally-conductive filler material.

6. The electrical feedthrough assembly of claim 1, further comprising a shell disposed about the collar, the shell configured to mount to an electronic module.

7. The electrical feedthrough assembly of claim 6, wherein an outer wall of the collar is mechanically and thermally joined to the shell.

8. The electrical feedthrough assembly of claim 1, wherein the electrical feedthrough assembly is configured to transfer electrical signals along the elongate conductor having an input power of at least 50 W and a frequency of at least 18 GHz.

9. The electrical feedthrough assembly of claim 8, wherein the electrical feedthrough assembly is configured to transfer electrical signals along the elongate conductor having an input power across a range of 100 W to 300 W and at frequencies across a range of 30 GHz to 300 GHz.

10. The electrical feedthrough assembly of claim 1, wherein, at the one or more operating frequencies, the length of the electrical feedthrough assembly is selected to provide a back-to-back quarter wave transform that includes at least two quarter wave transforms.

11. The electrical feedthrough assembly of claim 10, wherein a length of the collar is selected to provide the at least one quarter wave transform.

12. The electrical feedthrough assembly of claim 11, wherein at least one of the length of the collar and a length of the elongate conductor is selected to provide a second back-to-back quarter wave transform.

13. The electrical feedthrough assembly of claim 1, wherein a thermal conductivity of the collar is in a range of 200 W/(m-K) to 330 W/(m-K).

14. An electrical feedthrough assembly comprising:
an elongate conductor composed of a nonferrous material; and
a thermally conductive, dielectric collar at least partially surrounding the elongate conductor along a portion of a length of the elongate conductor, an inner wall of the collar mechanically and thermally joined to the portion of the length of the elongate conductor; and
a layer of conductive filler material disposed between the inner wall of the collar and the elongate conductor, the layer of conductive filler material mechanically and thermally connecting the inner wall of the collar to the elongate conductor along the portion of the length of the elongate conductor.

15. The electrical feedthrough assembly of claim 14, wherein the collar is composed of a material having a thermal conductivity of at least 170 W/(m-K).

16. An electrical feedthrough assembly comprising:
an elongate conductor;
a collar at least partially surrounding the elongate conductor along a portion of a length of the elongate conductor; and
a layer of conductive filler material disposed between an inner wall of the collar and the elongate conductor mechanically, the layer of conductive filler material thermally connecting the inner wall of the collar to the elongate conductor along the portion of the length of the elongate conductor
wherein, at one or more operating frequencies, at least a portion of a length of the electrical feedthrough assembly is selected to provide at least one quarter wave transform.

17. The electrical feedthrough assembly of claim 16, wherein the elongate conductor is composed of a nonferrous material.

18. The electrical feedthrough assembly of claim 16, wherein the collar is composed of a material having a thermal conductivity of at least 200 W/(m-K).

* * * * *